(12) United States Patent
Qian et al.

(10) Patent No.: US 10,589,630 B2
(45) Date of Patent: Mar. 17, 2020

(54) ELECTRIFIED VEHICLE DRIVETRAIN MONITORING SYSTEM

(71) Applicant: Ford Global Technologies, LLC, Dearborn, MI (US)

(72) Inventors: Lewei Qian, Novi, MI (US); Duane M. Grider, Farmington Hills, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 196 days.

(21) Appl. No.: 15/783,736

(22) Filed: Oct. 13, 2017

(65) Prior Publication Data

US 2019/0111786 A1 Apr. 18, 2019

(51) Int. Cl.
*B60L 3/00* (2019.01)
*G01R 31/00* (2006.01)
*G01R 31/02* (2006.01)
*B60L 50/51* (2019.01)
*B60L 53/16* (2019.01)
*B60L 50/64* (2019.01)
*B60T 8/1755* (2006.01)

(52) U.S. Cl.
CPC ............ *B60L 3/0069* (2013.01); *B60L 50/51* (2019.02); *B60L 50/64* (2019.02); *B60L 53/16* (2019.02); *G01R 31/007* (2013.01); *G01R 31/025* (2013.01); *B60L 2210/14* (2013.01); *B60L 2210/42* (2013.01); *B60T 8/1755* (2013.01); *B60T 2260/06* (2013.01); *B60T 2260/08* (2013.01); *B60T 2270/402* (2013.01); *B60T 2270/406* (2013.01); *B60Y 2200/91* (2013.01); *B60Y 2200/92* (2013.01)

(58) Field of Classification Search
CPC .... B60L 3/0069; B60L 11/1879; B60L 50/51; B60L 50/64; B60L 53/16; B60L 2210/14; B60L 2210/42; B60T 2260/06; B60T 2260/08; B60T 2270/402; B60T 2270/406; B60T 8/1755; B60Y 2200/91; B60Y 2200/92; G01R 31/007; G01R 31/025
See application file for complete search history.

(56) References Cited

U.S. PATENT DOCUMENTS

| | | | |
|---|---|---|---|
| 6,678,132 B1 * | 1/2004 | Carruthers ............ | B60L 3/0023 361/42 |
| 6,856,137 B2 * | 2/2005 | Roden ................... | B60L 3/0061 324/509 |
| 8,278,934 B2 * | 10/2012 | Wang ................... | H02P 29/0241 324/509 |
| 9,188,620 B1 | 11/2015 | Wagner | |

(Continued)

FOREIGN PATENT DOCUMENTS

CN 104407269 A 3/2015

*Primary Examiner* — Jerrah Edwards
(74) *Attorney, Agent, or Firm* — David Kelley; Brooks Kushman PC

(57) ABSTRACT

A control system for a vehicle includes a controller. The controller is configured to open traction battery contactors based on a potential between high-voltage cables and a chassis continuously exceeding an amplitude threshold for at least a predefined duration of time. The controller is further configured to selectively open the contactors based on data derived from the potential for periods that are each defined by the potential exceeding and then falling below the amplitude threshold without exceeding the predefined duration of time.

18 Claims, 4 Drawing Sheets

(56) References Cited

U.S. PATENT DOCUMENTS

| | | | |
|---|---|---|---|
| 2003/0155928 A1* | 8/2003 | Roden | B60L 3/0061 |
| | | | 324/509 |
| 2010/0207634 A1* | 8/2010 | Wang | G01R 31/025 |
| | | | 324/509 |
| 2012/0026631 A1* | 2/2012 | Kazemi | H02H 3/16 |
| | | | 361/42 |
| 2012/0290882 A1 | 11/2012 | Corkum | |

* cited by examiner

… (US 10,589,630 B2)

ELECTRIFIED VEHICLE DRIVETRAIN MONITORING SYSTEM

TECHNICAL FIELD

This application is generally related to a monitor system for an electrified vehicle powertrain having an isolated high voltage system that is configured to detect an intermittent ground fault.

BACKGROUND

Electrified vehicles (EVs) including hybrid-electric vehicles (HEVs) and battery electric vehicles (BEVs) rely on a traction battery to provide power to a traction motor for propulsion and a power inverter therebetween to convert direct current (DC) power to alternating current (AC) power. The typical AC traction motor is a 3-phase motor that may be powered by 3 sinusoidal signals each driven with 120 degrees phase separation. The traction battery is configured to operate in a particular voltage range and provide a current. However, improved performance of electric machines may be achieved by operating in a different voltage range, typically at voltages greater than the traction battery terminal voltage. Likewise, the current requirements to drive a vehicular electric machine are commonly referred to as high current. The traction battery is alternatively referred to as a high-voltage battery and the components of the electric-drive (e.g., traction electric machine, inverter, converter, battery, changer, etc.) are referred to as a high-voltage electrical system, or high-voltage powertrain system. Along with this high-voltage electrical system is a low-voltage electric system which is typically operated at a 12V nominal voltage. The low-voltage electrical system powers many vehicular systems such as radio, navigation systems, vehicle controllers, etc. The low-voltage electric system typically uses conductors for the positive low voltage and the vehicle chassis to carry the negative low voltage, while the high-voltage electric system has dedicated conductors for carrying both positive and negative high voltages.

SUMMARY

A control system for a vehicle includes a controller. The controller is configured to open traction battery contactors based on a potential between high-voltage cables and a chassis continuously exceeding an amplitude threshold for at least a predefined duration of time. The controller is further configured to selectively open the contactors based on data derived from the potential for periods that are each defined by the potential exceeding and then falling below the amplitude threshold without exceeding the predefined duration of time.

A vehicle fault detection method includes, responsive to a potential between high-voltage cables and a chassis continuously exceeding an amplitude threshold for at least a predefined duration of time, opening traction battery contactors. The method further includes responsive to data derived from the potential for periods that are each defined by the potential exceeding and then falling below the amplitude threshold without exceeding the predefined duration of time, selectively opening the contactors.

A vehicle includes contactors and a controller. The contactors couple a traction battery with an electric machine via high-voltage cables. The controller is configured to, responsive to the vehicle being stopped and frequency domain data derived from a detected potential between the high-voltage cables and a chassis for periods that are each defined by the potential exceeding and then falling below an amplitude threshold without exceeding a predefined duration of time, selectively open the contactors.

DETAILED DESCRIPTION

Figure 1:
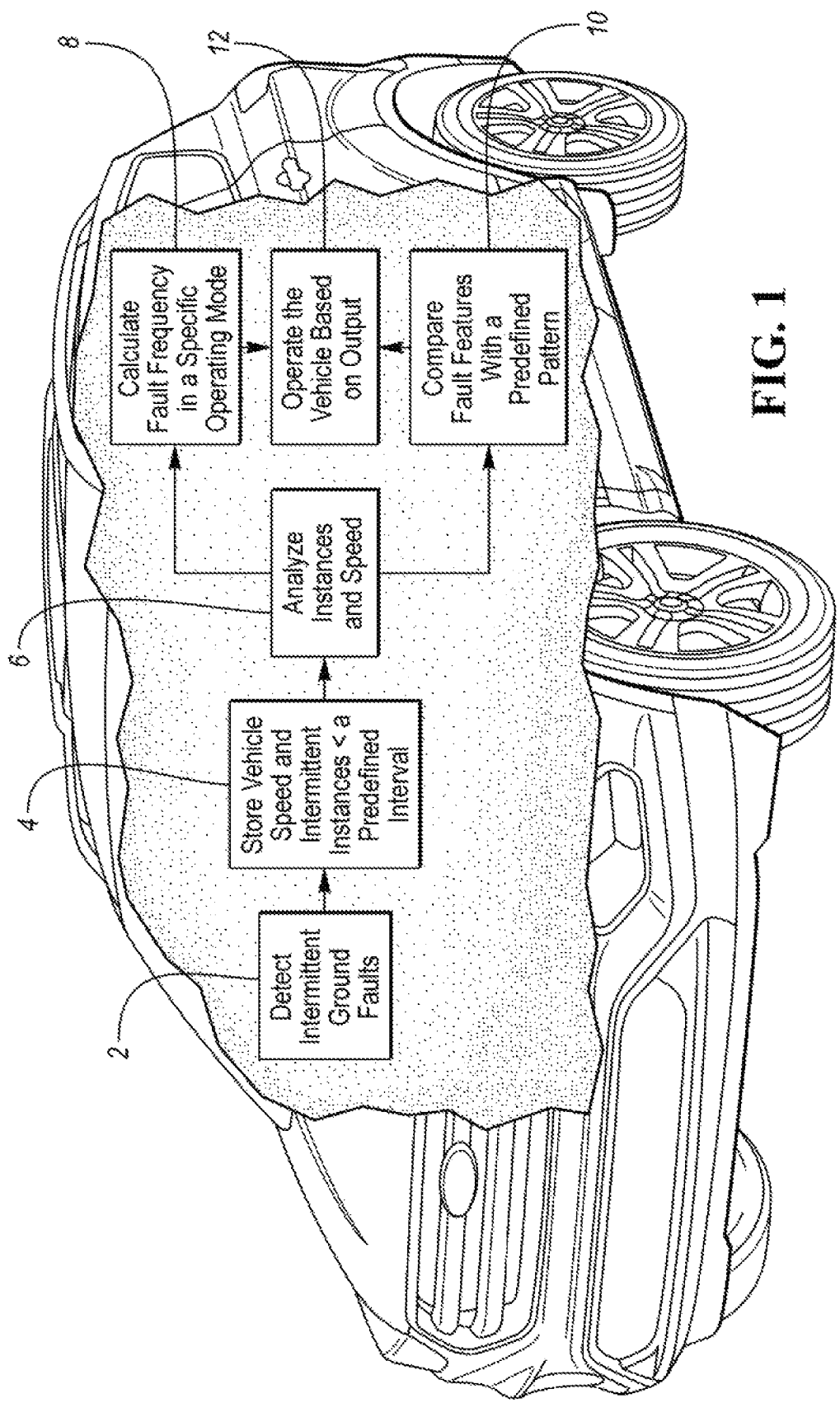
FIG. 1 is a flow diagram of an intermitted ground/isolation fault detection monitoring system for an electrified vehicle.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

An electrified vehicle typically has both a high-voltage subsystem and a low-voltage system. The high-voltage subsystem may include a traction battery, a DC-DC converter, a DC-AC inverter, and an electric machine. The low-voltage system may include a low-voltage (an accessory battery or 12-volt battery), an engine starter, vehicle accessories such as power seats, power windows, power doors, power locks, and window defrosters, and vehicular control modules and subsystems including anti-lock brakes, airbags, safety systems, adaptive steering, adaptive cruise control, a radiator fan, a distributor, in-vehicle entertainment, telecommunication unit, instrument cluster, vehicle display, and other low-voltage components. In most vehicular implementations, the low-voltage system is not isolated from the chassis in that the chassis serves as a return path for the current. This is accomplished by isolating positive voltages using insulators such as insulated wires and cables while shorting the negative terminal of the battery with the vehicle chassis. This uses the chassis as a return path reducing the need for insulated wires and cables for all negative voltages. However, in most hybrid or electric vehicular implementations, the high-voltage system is electrically isolated in that neither the negative voltage nor the positive voltage are shorted with the chassis. The high-voltage system is configured such that both negative and positive terminals are isolated, typically using both insulated negative cables and insulated positive cables. As such the high-voltage subsystem is referred to as being at a high impedance or ungrounded (floating) with respect to the chassis (or ground). As such that potential of either a negative or positive wire or cable may be substantially greater than or less than the vehicle chassis or ground. To protect against an unwanted discharge, electric/hybrid drive vehicles use an insulation monitor system or ground fault detection system to check and monitor the integrity of the high-voltage (HV) system (including the insulation of the wires, cables, and components).

Insulation monitor systems also known as ground/isolation fault detection systems typically monitor a leakage current through the system and convert the leakage to a signal (e.g., signal indicative of a voltage read by a controller) to determine whether a ground fault exists. For solid ground fault, (i.e., the ground fault is persistent), traditional ground/chassis fault detection systems work well. However, in some applications, like vehicles which are subjected to a harsh environment, (i.e., vibration/bouncing, temperature changes, salt/water spray, debris, routing of cables and components, etc.) HV cables, busbar insulation and other components may breakdown such that specific points/areas might not have a solid/consistent contact to the chassis. This intermittent contact with the chassis may be such that a controller is configured to ignore the intermittent shorts as noise. Here, the intermittent ground faults are stored and analyzed to detect patterns that match vehicle operation. The patterns may be indicative of fault that may be undetectable by traditional methods and system and can be used to catch potential faults prior to any major issue.

An example of the analysis includes converting the time domain signal to a frequency domain signal such that occurrences at frequencies that generally correspond to a speed of the vehicle, a harmonic of the vehicle speed, a speed of an internal combustion engine (ICE), a harmonic of the speed of the ICE, or a speed of an electric machine may be indicative of a fault associated with vehicle operation. One way to convert the time domain signal into a frequency domain signal is to perform a Fourier transform on the time domain signal. Another way is to perform a band pass filter or a filter bank. Further the system can be configured to adjust the sample time to correspond to the frequency of interest.

FIG. 1 depicts a flow diagram of an intermitted ground/isolation fault detection monitoring system for a vehicle. Here a controller is configured to detect intermittent ground/chassis faults by receiving intermittent ground/chassis fault data in step 2. The data may a continuous signal such as an amplitude signal that is continuously received by the controller. The controller may be configured with a comparator such that if the amplitude exceeds an amplitude threshold a record is generated. The record may include the peak amplitude and a pulse duration. If the pulse duration exceeds a pulse threshold, the system may output a ground/chassis fault. Based on the ground/chassis fault, a high-voltage switch may be disengaged thereby disconnecting a traction battery from other high-voltage components. However, if the pulse is less than the pulse duration, characteristics are stored by the controller in step 4. The characteristics includes a speed of the vehicle, a speed of an internal combustion engine (ICE), a speed of an electric machine, an amplitude of the fault signal, a waveform of the fault signal, an integral of the fault signal, and an operating mode of the vehicle. The characteristics stored in block 4 are analyzed by the controller in step 6. The controller may determine a response (e.g., a frequency response, or a harmonic) of the vehicle speed, the speed of the ICE, the fault signal, or vehicle motion based on the characteristics. This includes comparing the characteristics (e.g., fault features) with predetermined patterns as shown in block 10. The vehicle motion frequency response is the frequency response of the vehicle traveling along a roadway. For example, the vehicle motion frequency response may be due to an out of balance tire, periodic humps or potholes in a roadway, etc. The vehicle motion frequency response may be based on signals from a module such as an electronic stability control module or an active suspension control module. The frequency responses described above are analyzed to determine if movement such as a periodic vibration or sudden jolt corresponds with an intermittent chassis fault. Along with the frequency response, an operating mode of the vehicle may also be used to calculate fault characteristics such as a fault frequency as shown in block 8. The controller will then operate the vehicle based on the comparisons of blocks 8 and 10 as illustrated in block 12. The operation of the vehicle described in block 12 includes opening contactors to disable the high-voltage system such that the traction battery is disconnected from the other high-voltage components. The operation also includes starting an internal combustion engine (ICE) to transition vehicular propulsive power from an electric machine to an ICE. The operation may also include maintaining the contactors in a closed position such that the battery is still powering the high-voltage system, and also starting the ICE so that the system is in a ready state to transition from propulsion by the electric machine to the ICE.

Figure 2:
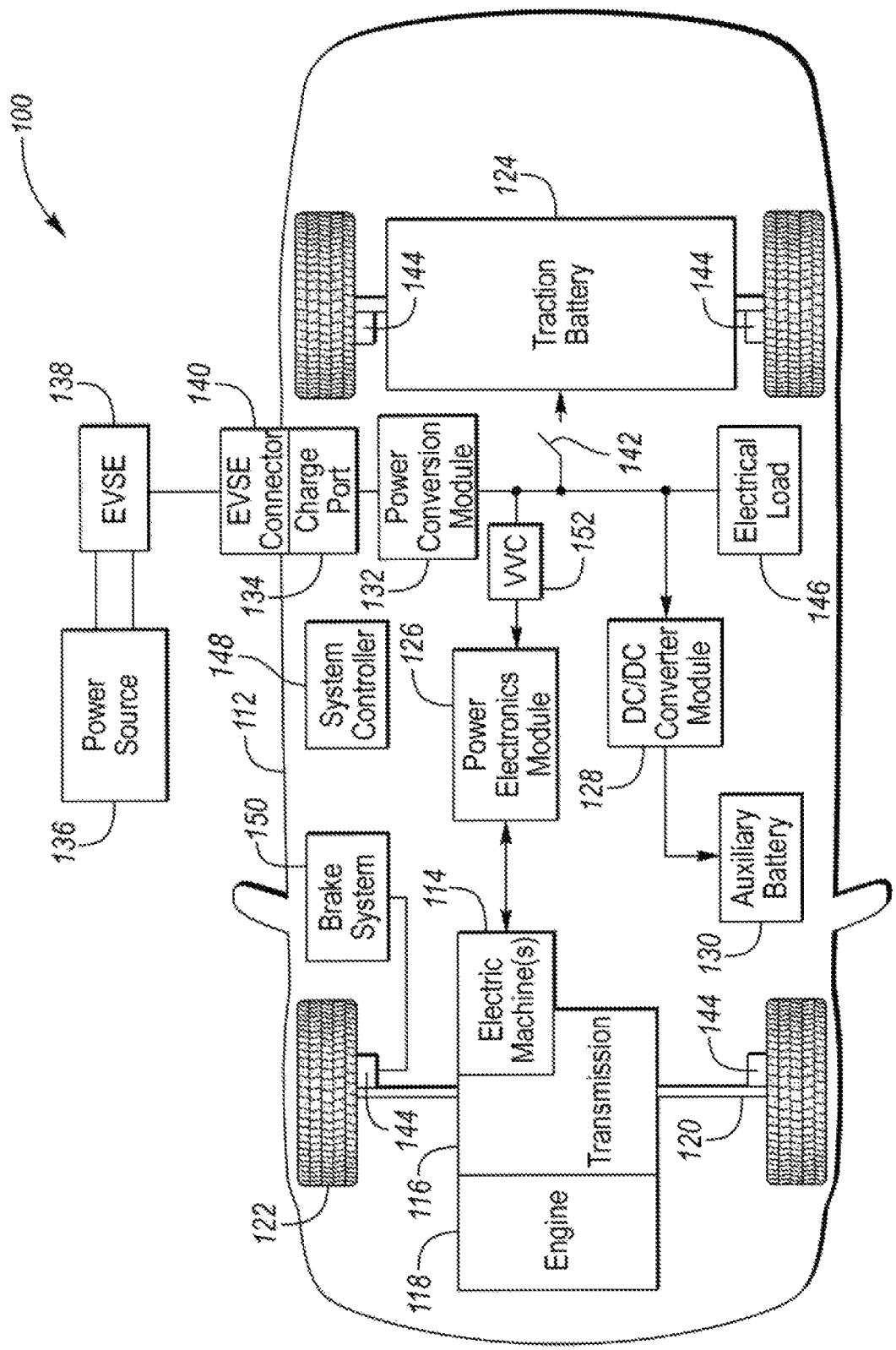
FIG. 2 is a diagram of a hybrid vehicle illustrating typical drivetrain and energy storage components including a variable voltage variable frequency converter.

FIG. 2 depicts an electrified vehicle 112 that may be referred to as a plug-in hybrid-electric vehicle (PHEV). A plug-in hybrid-electric vehicle 112 may comprise one or more electric machines 114 mechanically coupled to a hybrid transmission 116. The electric machines 114 may be capable of operating as a motor or a generator. In addition, the hybrid transmission 116 is mechanically coupled to an engine 118. The hybrid transmission 116 is also mechanically coupled to a drive shaft 120 that is mechanically coupled to the wheels 122. The electric machines 114 can provide propulsion and deceleration capability when the engine 118 is turned on or off. The electric machines 114 may also act as generators and can provide fuel economy benefits by recovering energy that would normally be lost as heat in a friction braking system. The electric machines 114 may also reduce vehicle emissions by allowing the engine 118 to operate at more efficient speeds and allowing the hybrid-electric vehicle 112 to be operated in electric mode with the engine 118 off under certain conditions. An electrified vehicle 112 may also be a battery electric vehicle (BEV). In a BEV configuration, the engine 118 may not be present. In other configurations, the electrified vehicle 112 may be a full hybrid-electric vehicle (FHEV) without plug-in capability.

A traction battery or battery pack 124 stores energy that can be used by the electric machines 114. The vehicle battery pack 124 may provide a high-voltage direct current (DC) output. The traction battery 124 may be electrically coupled to one or more power electronics modules 126. One or more contactors 142 may isolate the traction battery 124 from other components when opened and connect the traction battery 124 to other components when closed. The power electronics module 126 is also electrically coupled to the electric machines 114 and provides the ability to bi-directionally transfer energy between the traction battery 124 and the electric machines 114. For example, a traction battery 124 may provide a DC voltage while the electric machines 114 may operate with a three-phase alternating current (AC) to function. The power electronics module 126 may convert the DC voltage to a three-phase AC current to operate the electric machines 114. In a regenerative mode, the power electronics module 126 may convert the three-phase AC current from the electric machines 114 acting as generators to the DC voltage compatible with the traction battery 124.

The vehicle 112 may include a variable-voltage converter (VVC) 152 electrically coupled between the traction battery 124 and the power electronics module 126. The VVC 152 may be a DC/DC boost converter configured to increase or boost the voltage provided by the traction battery 124. By increasing the voltage, current requirements may be decreased leading to a reduction in wiring size for the power electronics module 126 and the electric machines 114. Further, the electric machines 114 may be operated with better efficiency and lower losses.

In addition to providing energy for propulsion, the traction battery 124 may provide energy for other vehicle electrical systems. The vehicle 112 may include a DC/DC converter module 128 that converts the high-voltage DC output of the traction battery 124 to a low voltage DC supply that is compatible with low-voltage vehicle loads. An output of the DC/DC converter module 128 may be electrically coupled to an auxiliary battery 130 (e.g., 12V battery) for charging the auxiliary battery 130. The low-voltage systems may be electrically coupled to the auxiliary battery 130. One or more electrical loads 146 may be coupled to the high-voltage bus. The electrical loads 146 may have an associated controller that operates and controls the electrical loads 146 when appropriate. Examples of electrical loads 146 may be a fan, an electric heating element and/or an air-conditioning compressor.

The electrified vehicle 112 may be configured to recharge the traction battery 124 from an external power source 136. The external power source 136 may be a connection to an electrical outlet. The external power source 136 may be electrically coupled to a charger or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for plugging into a charge port 134 of the vehicle 112. The charge port 134 may be any type of port configured to transfer power from the EVSE 138 to the vehicle 112. The charge port 134 may be electrically coupled to a charger or on-board power conversion module 132. The power conversion module 132 may condition the power supplied from the EVSE 138 to provide the proper voltage and current levels to the traction battery 124. The power conversion module 132 may interface with the EVSE 138 to coordinate the delivery of power to the vehicle 112. The EVSE connector 140 may have pins that mate with corresponding recesses of the charge port 134. Alternatively, various components described as being electrically coupled or connected may transfer power using a wireless inductive coupling.

One or more wheel brakes 144 may be provided for decelerating the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system 150 may include a controller to monitor and coordinate the brake system 150. The brake system 150 may monitor the brake components and control the wheel brakes 144 for vehicle deceleration. The brake system 150 may respond to driver commands and may also operate autonomously to implement features such as stability control. The controller of the brake system 150 may implement a method of applying a requested brake force when requested by another controller or sub-function.

Electronic modules in the vehicle 112 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 130. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 2 but it may be implied that the vehicle network may connect to any electronic module that is present in the vehicle 112. A vehicle system controller (VSC) 148 may be present to coordinate the operation of the various components.

Often the VVC 152 is configured as a boost converter. The VVC 152 may include input terminals that may be coupled to terminals of the traction battery 124 through the contactors 142. The VVC 152 may include output terminals coupled to terminals of the power electronics module 126. The VVC 152 may be operated to cause a voltage at the output terminals to be greater than a voltage at the input terminals. The vehicle 112 may include a VVC controller that monitors and controls electrical parameters (e.g., voltage and current) at various locations within the VVC 152. In some configurations, the VVC controller may be included as part of the VVC 152. The VVC controller may determine an output voltage reference, $V_{dc}^*$. The VVC controller may determine, based on the electrical parameters and the voltage reference, $V_{dc}^*$, a control signal sufficient to cause the VVC 152 to achieve the desired output voltage. In some configurations, the control signal may be implemented as a pulse-width modulated (PWM) signal in which a duty cycle of the PWM signal is varied. The control signal may be operated at a predetermined switching frequency. The VVC controller may command the VVC 152 to provide the desired output voltage using the control signal. The particular control signal at which the VVC 152 is operated may be directly related to the amount of voltage boost to be provided by the VVC 152.

With reference to FIG. 2, the VVC 152 may boost or "step up" the voltage potential of the electrical power provided by the traction battery 124. The traction battery 124 may provide high-voltage (HV) DC power. In some configurations, the traction battery 124 may provide a voltage between 150 and 400 Volts. The contactor 142 may be electrically coupled in series between the traction battery 124 and the VVC 152. When the contactor 142 is closed, the HV DC power may be transferred from the traction battery 124 to the VVC 152. An input capacitor may be electrically coupled in parallel to the traction battery 124. The input capacitor may reduce any voltage and current ripple. The VVC 152 may receive the HV DC power and boost or "step up" the voltage potential of the input voltage according to the duty cycle. Often an output capacitor is electrically coupled between the output terminals of the VVC 152 and the input of the power electronics module 126 to stabilize the bus voltage and reduce voltage and current ripple at the output of the VVC 152.

Figure 3:
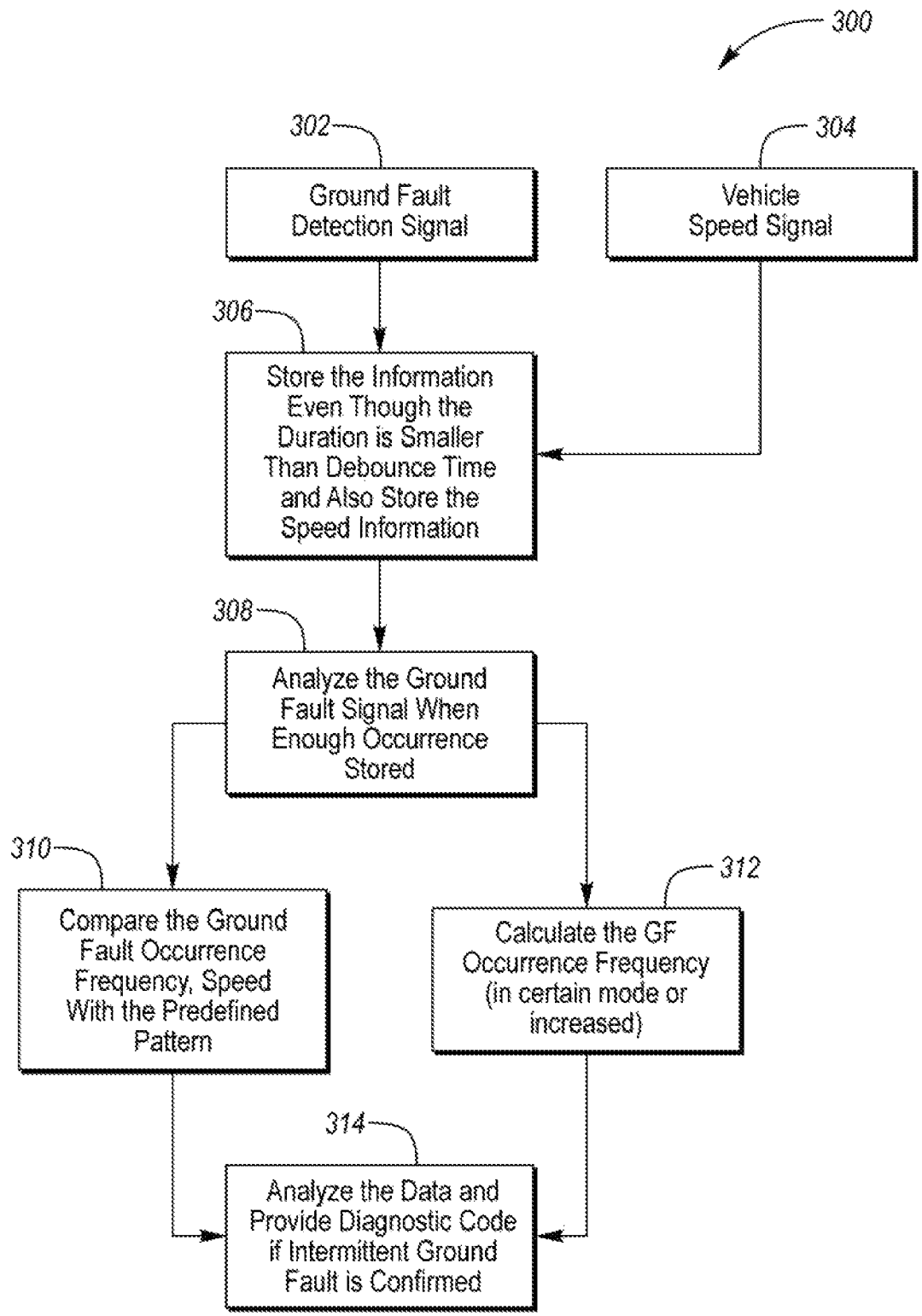
FIG. 3 is a flow diagram of an intermitted ground/isolation fault detection monitoring system.

FIG. 3 is a flow diagram of an intermitted ground fault detection monitoring system 300. Here a controller is configured to detect intermittent ground/chassis faults by receiving intermittent ground/chassis fault data in step 302. The data may a continuous signal such as an amplitude signal that is continuously received by the controller. The controller may be configured with a comparator such that if the amplitude exceeds an amplitude threshold a record is generated. The record may include the peak amplitude and a pulse duration. If the pulse duration exceeds a pulse threshold, the system may output a ground/chassis fault. In another embodiment, the fault detection signal may be sampling, of at least one voltage indicative of a voltage differential between the vehicle chassis and the high-voltage potentials, by an analog to digital (A/D) converter. The sampling rate may be adjusted based on characteristics in step 304 such as a vehicle speed, a rotational speed of an electric machine, or data from a suspension system.

Based on detection of ground/chassis fault, (i.e., a voltage differential exceeds both an amplitude threshold and a duration period threshold) a high-voltage switch may be disengaged thereby disconnecting a traction battery from other high-voltage components. The predefined duration of time (e.g., the duration period threshold) generally may be calculated as the time is equal to one divided by frequency or in other words Time=1/frequency. For example, an electric machine rotating at 3000 revolutions per minute (RPM) may generate a pulse period of 20 ms (3000 RPMs equals 50 rotations per second, and 1/50=0.020. Therefore, the predefined period may be set constant or may change as a rotational speed of an electric machine, a vehicle wheel, or an internal combustion engine changes. In another embodiment, if the car is operating when a ground/chassis/isolation fault is detected, the high-voltage switches may not be immediately disconnected, but after the vehicle is stopped and if the fault is still detected, the controller will inhibit the car from restarting.

Another indicator of intermittent ground fault is the fault signal is totally gone but appears again after the car starts to run. However, if the pulse is less than the pulse duration, characteristics are stored by the controller in step 306. The characteristics includes a speed of the vehicle, a speed of an internal combustion engine (ICE), a speed of an electric machine, an amplitude of the fault signal, a waveform of the fault signal, an integral of the fault signal, and an operating mode of the vehicle. The characteristics stored in block 306 are analyzed by the controller in step 308. The analysis may include converting a time domain signal to a frequency domain signal. The conversion may include performing a Fourier transform, a Fast Fourier Transform (FFT), a band-pass filter, a filter bank, average, weighted average, or other digital signal processing (DSP) algorithm. The controller may determine a response (e.g., a frequency response, or a harmonic) of the vehicle speed, the speed of the ICE, the fault signal, or vehicle motion based on the characteristics. This includes comparing the characteristics (e.g., fault features) with predetermined patterns as shown in block 310. The vehicle motion frequency response is the frequency response of the vehicle traveling along a roadway. For example, the vehicle motion frequency response may be due to an out of balance tire, periodic humps or potholes in a roadway, etc. The vehicle motion frequency response may be based on signals from a module such as an electronic stability control module or an active suspension control module. The frequency responses described above are analyzed to determine if movement such as a periodic vibration or sudden jolt corresponds with an intermittent chassis fault. Along with the frequency response, an operating mode of the vehicle may also be used to calculate fault characteristics such as a fault frequency as shown in block 312. The controller will then operate the vehicle based on the comparisons of blocks 310 and 312 as illustrated in block 314. The operation of the vehicle described in block 314 includes opening contactors to disable the high-voltage system such that the traction battery is disconnected from the other high-voltage components. The operation also includes starting an internal combustion engine (ICE) to transition vehicular propulsive power from an electric machine to an ICE. The operation may also include maintaining the contactors in a closed position such that the battery is still powering the high-voltage system, and also starting the ICE so that the system is in a ready state to transition from propulsion by the electric machine to the ICE.

Figure 4:
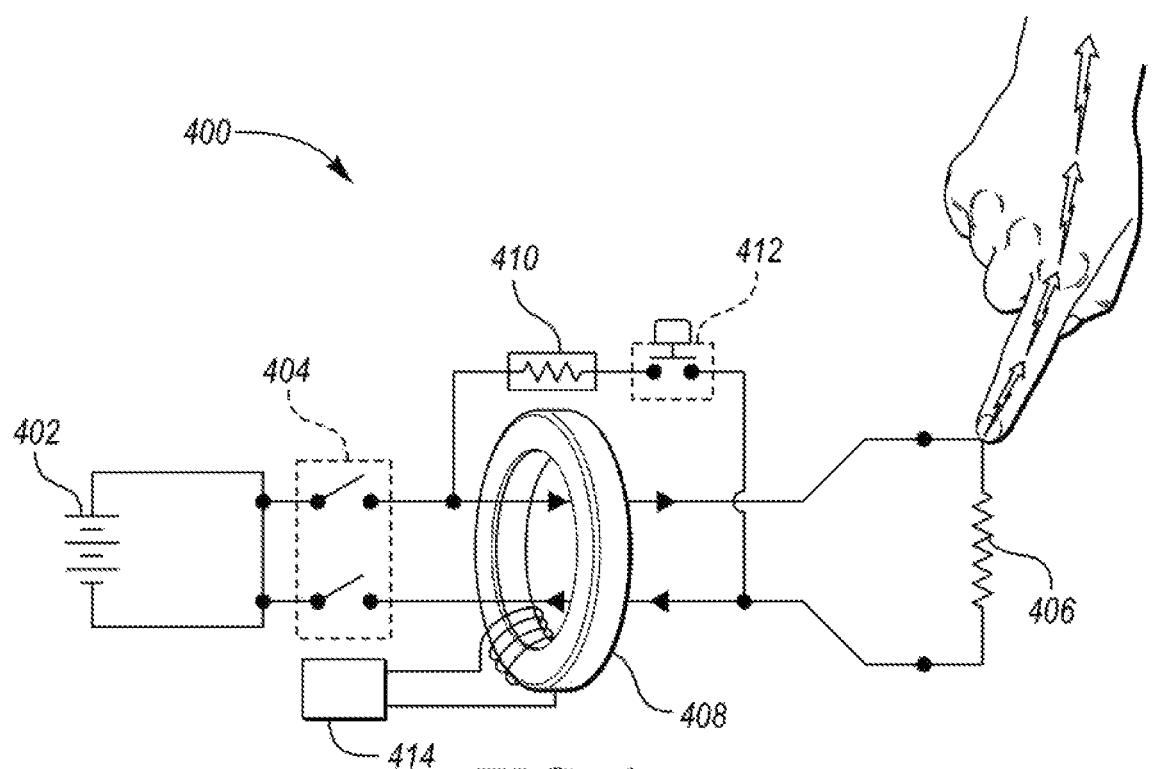
FIG. 4 is a schematic diagram of a ground/isolation fault detection system.

FIG. 4 is a schematic diagram of a ground fault detection system 400. Here, a power supply 402 such as a battery flows current through contactors 404 to a load 406. The current flows equally and opposite through a current transformer 408 such that, under no fault conditions, current flowing in each direction is equal and opposite and the detection circuitry 414 does not detect a fault. The circuit may have a test circuit including a resistor 410 and a momentary contact switch 412. The test circuit operated when the momentary switch 412 is pressed current bypasses the current transformer in one direction and no the other direction such that the currents are now not equal. The current differential is detected the detection circuitry 414 via a winding on the transformer. When the fault is detected, the circuitry 414 opens the contactors 404.

Figure 5:
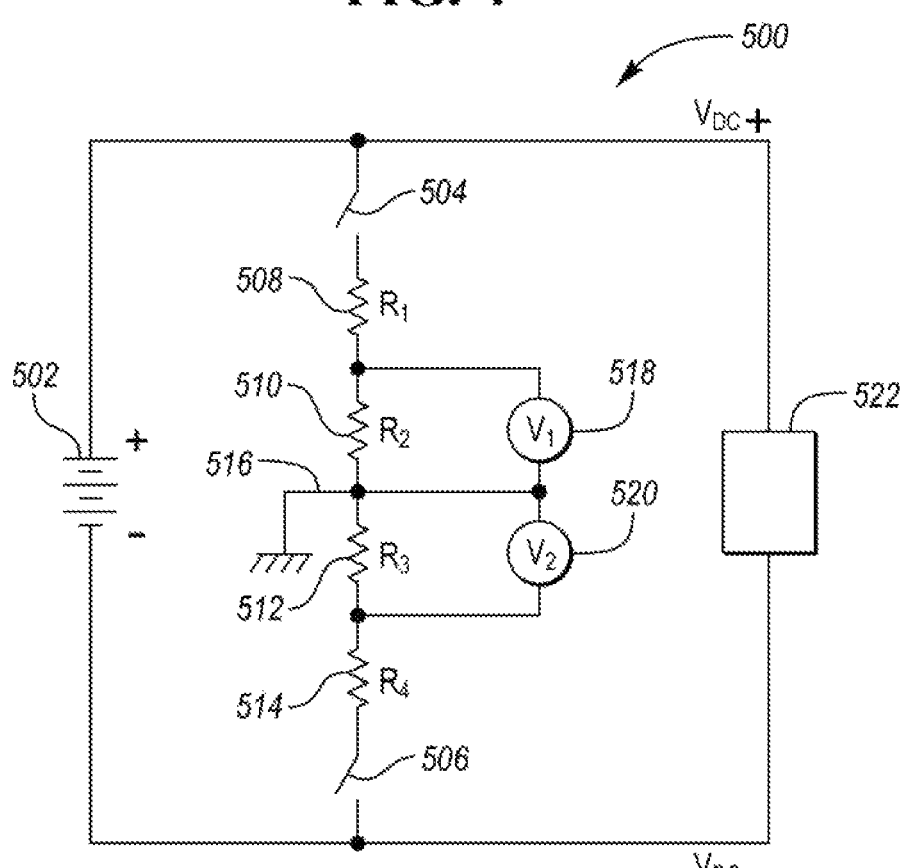
FIG. 5 is a schematic diagram of a leakage detection system for ground/isolation fault detection.

FIG. 5 is a schematic diagram of a chassis fault detection system 500. Here a power supply 502 such as a traction battery for a vehicle is used to provide power to a load 522. In this system, both negative and positive voltage busses are isolated and can "float" relative to a fix potential such as chassis ground or earth ground. As the voltage busses are isolated, the voltage difference between either positive or negative voltage bus and ground can be easily manipulated. Here two contactors 504 and 506 are used to engage a string of series resistors 508, 510, 512, and 514. The resistor chain includes a connection to chassis ground 516 such that a resistor divider is above the chassis ground 516 and a resistor divider is below the chassis ground 516. For the high-side resistor divider, resistor R1 508 and resistor R2 510 divide the voltage differential between the positive DC bus voltage and the chassis ground 516. If resistor R1 508 is much greater than resistor R2 510, the voltage across resistor R2 510 will be much less than the voltage across resistor R1 508. The voltage across resistor R2 510 may then be measured by a high-side voltmeter 518. Likewise, For the low-side resistor divider, resistor R3 512 and resistor R4 514 divide the voltage differential between the positive DC bus voltage and the chassis ground 516. If resistor R4 514 is much greater than resistor R3 512, the voltage across resistor R3 512 will be much less than the voltage across resistor R4

514. The voltage across resistor R3 512 may then be measured by a low-side voltmeter 520. If the battery 502 is a high-voltage, (e.g., 200V) and the high and low-side resistor dividers equally split the high-voltage, it still may not be practical to have the individual resistor dividers equally sub-divide the voltage as the voltage between the chassis ground and positive bus voltage would still be 100V and the voltmeter may then be required to measure up to 100V. However, by making the outer resistors (508 and 514) larger than the measuring resistors (510 and 512) the large voltage offset would be reduced.

Here, when a chassis fault occurs, a voltage offset between the chassis ground and positive and negative bus voltages changes. For example, if there is a chassis fault between the positive high-voltage bus and the chassis, the voltage measured by voltmeter V1 518 would drop and the voltage measured by voltmeter V2 520 would increase. When the chassis fault is removed, the series resistor chain would act like a simple resistor divider such that if the high-side and low-side resistor dividers are equal, the voltages measured by voltmeter V1 518 and V2 520 would return to being equal.

In one embodiment, the contactors are not immediately opened, but a flag is set such that when the vehicle is stopped or the vehicle is in a key-off condition, if the fault is confirmed, the vehicle is inhibited from starting and a notice is output for the owner/operator (e.g., ask the drive to check the vehicle). Further based on a fault frequency characteristic, a location of the fault may be obtained. For example, a component mounted on a transmission may have a different fault frequency characteristic than a chassis mounted component, or a ICE mounted component.

Control logic or functions performed by controller may be represented by flow charts or similar diagrams in one or more figures. These figures provide representative control strategies and/or logic that may be implemented using one or more processing strategies such as event-driven, interrupt-driven, multi-tasking, multi-threading, and the like. As such, various steps or functions illustrated may be performed in the sequence illustrated, in parallel, or in some cases omitted. Although not always explicitly illustrated, one of ordinary skill in the art will recognize that one or more of the illustrated steps or functions may be repeatedly performed depending upon the particular processing strategy being used. Similarly, the order of processing is not necessarily required to achieve the features and advantages described herein, but are provided for ease of illustration and description. The control logic may be implemented primarily in software executed by a microprocessor-based vehicle, engine, and/or powertrain controller, such as controller. Of course, the control logic may be implemented in software, hardware, or a combination of software and hardware in one or more controllers depending upon the particular application. When implemented in software, the control logic may be provided in one or more computer-readable storage devices or media having stored data representing code or instructions executed by a computer to control the vehicle or its subsystems. The computer-readable storage devices or media may include one or more of a number of known physical devices which utilize electric, magnetic, and/or optical storage to keep executable instructions and associated calibration information, operating variables, and the like.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A control system for a vehicle comprising:
a controller configured to
open traction battery contactors based on a potential between high-voltage cables and a chassis continuously exceeding an amplitude threshold for at least a predefined duration of time, and
selectively open the traction battery contactors based on vehicle speed and data derived from the potential for periods that are each defined by the potential exceeding and then falling below the amplitude threshold without exceeding the predefined duration of time.

2. The system of claim 1, wherein the controller is further configured to selectively output an indicator of a fault based on the data.

3. The system of claim 2, wherein the indicator identifies a location on the vehicle associated with the fault.

4. The system of claim 1, wherein the amplitude threshold is based on vehicle speed or electric machine rotational speed.

5. The system of claim 1, wherein the predefined duration of time is based on electric machine rotational speed.

6. The system of claim 1, wherein the data is frequency domain data.

7. The system of claim 1, wherein the controller is further configured to derive the data via Fourier Transform or band-pass filtering.

8. A vehicle fault detection method comprising:
responsive to a potential between high-voltage cables and a chassis continuously exceeding an amplitude threshold for at least a predefined duration of time, opening traction battery contactors, wherein the amplitude threshold is based on vehicle speed or electric machine rotational speed, and
responsive to data derived from the potential for periods that are each defined by the potential exceeding and then falling below the amplitude threshold without exceeding the predefined duration of time, selectively opening the traction battery contactors.

9. The method of claim 8 further comprising selectively outputting an indicator of a fault based on the data.

10. The method of claim 9, wherein the indicator identifies a location in the vehicle associated with the fault.

11. The method of claim 8, wherein the selectively opening is further based on vehicle speed.

12. The method of claim 8, wherein the predefined duration of time is based on electric machine rotational speed.

13. The method of claim 8, wherein the data is frequency domain data.

14. The method of claim 8 further comprising deriving the data via Fourier Transform or band-pass filtering.

15. A vehicle comprising:
contactors coupling a traction battery with an electric machine via high-voltage cables; and
a controller configured to, responsive to the vehicle being stopped and frequency domain data derived from a detected potential between the high-voltage cables arid a chassis for periods that are each defined by the potential exceeding and then falling below an amplitude threshold without exceeding a predefined duration of time, selectively open the contactors, wherein the predefined duration of time is based on a rotational speed of the electric machine.

16. The vehicle of claim 15, wherein the controller is further configured to, responsive to the vehicle moving and the frequency domain data, selectively output an indicator of a fault.

17. The vehicle of claim 16, wherein the indicator identifies a location within the vehicle associated with the fault.

18. The vehicle of claim 15, wherein the controller is further configured to, responsive to the potential continuously exceeding the amplitude threshold for at least the predefined during of time, open the contactors.

* * * * *